(12) United States Patent
Liao et al.

(10) Patent No.: US 11,705,440 B2
(45) Date of Patent: Jul. 18, 2023

(54) MICRO LED DISPLAY PANEL

(71) Applicant: PlayNitride Inc., Hsinchu County (TW)

(72) Inventors: Kuan-Yung Liao, Hsinchu County (TW); Ching-Liang Lin, Hsinchu County (TW); Yun-Li Li, Hsinchu County (TW); Yu-Chu Li, Hsinchu County (TW)

(73) Assignee: PlayNitride Inc., Hsinchu County (TW)

( * ) Notice: Subject to any disclaimer, the term of this patent is extended or adjusted under 35 U.S.C. 154(b) by 104 days.

(21) Appl. No.: 17/224,053

(22) Filed: Apr. 6, 2021

(65) Prior Publication Data

US 2021/0225817 A1 Jul. 22, 2021

Related U.S. Application Data

(63) Continuation-in-part of application No. 16/018,080, filed on Jun. 26, 2018, now abandoned.

(30) Foreign Application Priority Data

Jun. 26, 2017 (TW) ................................ 106121222

(51) Int. Cl.
  *H01L 25/07* (2006.01)
  *H01L 25/075* (2006.01)
  *H01L 33/62* (2010.01)
  *H01L 25/16* (2023.01)

(52) U.S. Cl.
  CPC ........ *H01L 25/0753* (2013.01); *H01L 25/167* (2013.01); *H01L 33/62* (2013.01)

(58) Field of Classification Search
  CPC .... H01L 25/0753; H01L 25/167; H01L 33/62
  See application file for complete search history.

(56) References Cited

U.S. PATENT DOCUMENTS

| | | | | |
|---|---|---|---|---|
| 9,048,368 | B2* | 6/2015 | Jeong | H01L 27/153 |
| 9,159,700 | B2* | 10/2015 | Sakariya | H01L 33/06 |
| 9,337,175 | B2* | 5/2016 | Seo | H01L 33/62 |
| 9,831,220 | B2* | 11/2017 | Donofrio | H01L 25/0753 |
| 10,153,257 | B2* | 12/2018 | Cok | H01L 25/0753 |
| 10,312,224 | B2* | 6/2019 | Edmond | H01L 33/502 |

(Continued)

FOREIGN PATENT DOCUMENTS

| | | |
|---|---|---|
| CN | 104009187 | 8/2014 |
| CN | 106782128 | 5/2017 |

OTHER PUBLICATIONS

"Office Action of China Counterpart Application", dated Nov. 4, 2022, p. 1-p. 6.

*Primary Examiner* — Mohammed Shamsuzzaman
(74) *Attorney, Agent, or Firm* — JCIPRNET

(57) ABSTRACT

A micro LED display panel includes a driving substrate and a plurality of micro light emitting diodes (LEDs). The driving substrate has a plurality of pixel regions. Each of the pixel regions includes a plurality of sub-pixel regions. The micro LEDs are located on the driving substrate. At least one of the sub-pixel regions is provided with two micro LEDs of the micro LEDs electrically connected in series, and a dominant wavelength of the two micro LEDs is within a wavelength range of a specific color light. In a repaired sub-pixel region of the sub-pixel regions, only one of the two micro LEDs emits light. In a normal sub-pixel region of the sub-pixel regions, both of the two micro LEDs emit light.

9 Claims, 10 Drawing Sheets

(56) References Cited

U.S. PATENT DOCUMENTS

| | | | |
|---|---|---|---|
| 10,644,195 B2* | 5/2020 | Tian | H01L 33/30 |
| 2008/0094006 A1* | 4/2008 | Ye | G09G 3/3426 |
| | | | 315/294 |
| 2009/0121652 A1* | 5/2009 | Kang | G02F 1/133603 |
| | | | 315/297 |
| 2009/0267085 A1* | 10/2009 | Lee | H01L 33/20 |
| | | | 257/E33.056 |
| 2011/0089810 A1* | 4/2011 | Su | H01L 25/0753 |
| | | | 313/483 |
| 2011/0299044 A1* | 12/2011 | Yeh | H04N 9/315 |
| | | | 353/52 |
| 2011/0309378 A1* | 12/2011 | Lau | H01L 27/1214 |
| | | | 438/26 |
| 2012/0305949 A1* | 12/2012 | Donofrio | H01L 25/0753 |
| | | | 257/E33.066 |
| 2013/0002730 A1* | 1/2013 | Tanigawa | H01L 25/0753 |
| | | | 445/24 |
| 2013/0193453 A1* | 8/2013 | Donofrio | H01L 25/0753 |
| | | | 257/E33.061 |
| 2013/0208026 A1* | 8/2013 | Suzuki | H01L 33/36 |
| | | | 257/99 |
| 2013/0258663 A1* | 10/2013 | Woodgate | F21V 5/007 |
| | | | 362/329 |
| 2014/0186979 A1* | 7/2014 | Tu | H01L 33/0093 |
| | | | 438/27 |
| 2015/0295154 A1* | 10/2015 | Tu | H01L 24/73 |
| | | | 438/27 |
| 2015/0312461 A1* | 10/2015 | Kim | H01L 27/1464 |
| | | | 348/308 |
| 2015/0333230 A1* | 11/2015 | Moon | H01L 33/46 |
| | | | 257/88 |
| 2015/0364443 A1* | 12/2015 | Bilenko | H01L 23/49575 |
| | | | 257/773 |
| 2015/0371585 A1* | 12/2015 | Bower | F21V 9/08 |
| | | | 345/82 |
| 2015/0373793 A1* | 12/2015 | Bower | F21V 9/08 |
| | | | 362/20 |
| 2016/0124269 A1* | 5/2016 | Lee | G09G 3/342 |
| | | | 362/97.3 |
| 2016/0128143 A1* | 5/2016 | Kazikawa | G02F 1/1309 |
| | | | 324/414 |
| 2016/0181477 A1* | 6/2016 | Lee | H01L 33/42 |
| | | | 257/98 |
| 2016/0276326 A1* | 9/2016 | Natarajan | H01L 31/0475 |
| 2016/0293811 A1* | 10/2016 | Hussell | H01L 27/156 |
| 2016/0295144 A1* | 10/2016 | Kimura | H01L 27/14603 |
| 2016/0329376 A1* | 11/2016 | Kim | H01L 25/0753 |
| 2016/0358533 A1* | 12/2016 | Rotzoll | G09G 3/32 |
| 2017/0025075 A1* | 1/2017 | Cok | G09G 3/2003 |
| 2017/0141155 A1* | 5/2017 | Hughes | H01L 25/167 |
| 2017/0186740 A1* | 6/2017 | Cok | H01L 25/167 |
| 2017/0227169 A1* | 8/2017 | Jiang | F21V 3/02 |
| 2017/0279020 A1* | 9/2017 | Kim | H01L 24/11 |
| 2017/0294418 A1* | 10/2017 | Edmond | H01L 27/156 |
| 2017/0365755 A1* | 12/2017 | Chu | H01L 33/56 |
| 2018/0159088 A1* | 6/2018 | Lai | H01L 22/22 |
| 2018/0198020 A1* | 7/2018 | Lai | H01L 27/1225 |
| 2018/0226386 A1* | 8/2018 | Cok | H01L 27/124 |
| 2018/0295683 A1* | 10/2018 | Tung | H05B 45/44 |
| 2018/0323180 A1* | 11/2018 | Cok | H01L 23/5386 |
| 2019/0006559 A1* | 1/2019 | Lai | H01L 27/1214 |
| 2019/0006564 A1* | 1/2019 | Sasaki | H01L 21/561 |
| 2019/0386185 A1* | 12/2019 | Jiang | H01L 33/501 |
| 2019/0394879 A1* | 12/2019 | Hsieh | A61N 5/062 |

\* cited by examiner

MICRO LED DISPLAY PANEL

CROSS-REFERENCE TO RELATED APPLICATION

This application is a continuation-in-part application of and claims the priority benefit of U.S. application Ser. No. 16/018,080, filed on Jun. 26, 2018, now allowed, which claims the priority benefit of Taiwan application serial no. 106121222, filed on Jun. 26, 2017. The entirety of each of the above-mentioned patent applications is hereby incorporated by reference herein and made a part of this specification.

BACKGROUND OF THE INVENTION

Field of the Invention

The invention relates to a display device, and particularly to a micro LED display panel.

Description of Related Art

The micro Light-Emitting Diode display (micro-LED display) belongs to an active light emitting device display. Compared to the Liquid Crystal Display (LCD) or the Organic Light-Emitting Diode (OLED) display, the micro-LED display is more power efficient and has better contrast performance and visibility in the sun. In addition, since the micro-LED display uses inorganic materials, it has better reliability and longer service life than the OLED display. In a conventional display panel, each pixel is only provided one micro LED; therefore, the pixel cannot display a predetermined color image due to a malfunction in the micro LED. The display quality of the display panel is affected, especially in the passive driving display panel. In addition, due to epitaxial process variation of the micro LED, the wavelength range of each micro LED also varies; as a result, the brightness uniformity is getting worse and the display quality of the display panel is affected.

SUMMARY OF THE INVENTION

The invention provides a micro LED display panel, which has a better display quality.

The micro LED display panel of the invention includes a driving substrate and a plurality of micro light emitting diodes (LEDs). The driving substrate has a plurality of pixel regions. Each of the pixel regions includes a plurality of sub-pixel regions. The micro LEDs are located on the driving substrate. At least one of the sub-pixel regions is provided with two micro LEDs of the micro LEDs electrically connected in series, and a dominant wavelength of the two micro LEDs is within a wavelength range of a specific color light. In a repaired sub-pixel region of the sub-pixel regions, only one of the two micro LEDs emits light. In a normal sub-pixel region of the sub-pixel regions, both of the two micro LEDs emit light.

In one embodiment of the invention, under the same specific brightness condition, a current input to the repaired sub-pixel region is greater than a current input to the normal sub-pixel region.

In one embodiment of the invention, the plurality of sub-pixel regions comprises a first sub-pixel region, a second sub-pixel region and a third sub-pixel region. Sizes of the first sub-pixel region, the second sub-pixel region and the third sub-pixel region are the same.

In one embodiment of the invention, the two micro LEDs are located in the first sub-pixel region, and the two micro LEDs are two red micro LEDs.

In one embodiment of the invention, the second sub-pixel region is provide with a green micro LED of the micro LEDs, and the third sub-pixel region is provide with a blue micro LED of the micro LEDs. There is no series circuit in the second sub-pixel region and the third sub-pixel region.

In one embodiment of the invention, the second sub-pixel region is further provide with a first redundancy position, and the third sub-pixel region is further provide with a second redundancy position.

In one embodiment of the invention, the second sub-pixel region is further provide another green micro LED of the micro LEDs located on the first redundancy position and electrically connected in parallel with the green micro LED of the micro LEDs.

In one embodiment of the invention, in the first sub-pixel region, both of the two red micro LEDs emit light, in the second sub-pixel region, only the another green micro LED emits light, and in the third sub-pixel region, the blue micro LED emits light.

In one embodiment of the invention, the third sub-pixel region is further provide another blue micro LED of the micro LEDs located on the second redundancy position and electrically connected in parallel with the blue micro LED of the micro LEDs.

In one embodiment of the invention, in the first sub-pixel region, both of the two red micro LEDs emit light, in the second sub-pixel region, the green micro LED emits light, and in the third sub-pixel region, only the another blue micro LED emits light.

In one embodiment of the invention, the second sub-pixel region is provide with two green micro LEDs of the micro LEDs electrically connected in series, and the third sub-pixel region is provide with two blue micro LEDs of the micro LEDs electrically connected in series.

In one embodiment of the invention, the driving substrate further includes a plurality of first-type electrode layers, a plurality of second-type electrode layers and a plurality of connecting layers. The first-type electrode layers includes a plurality of first portions and a plurality of second portions. A first length of each of the first portions is smaller than a second length of each of the second portions. A portion of the second-type electrode layers includes a plurality of protrusions. The first sub-pixel region is provided with one of the first portions, one of the protrusions, and one of the connecting layers. The second sub-pixel region and the third sub-pixel region are respectively provided with one of the second portions and one of the second-type electrode layers without the protrusions.

In one embodiment of the invention, a length of each of the micro LEDs ranges from 3 μm to 50 μm.

In summary, according to the design of the micro LED display panel of the invention, each one of the pixel regions is at least provided with the first micro LED and the second micro LED that are connected in series. Therefore, the display panel of the invention at least has one of the following advantages: (1) when one micro LED in each pixel region is malfunctioned, another micro LED can still emit light normally so that each pixel region can operate normally and emit the predetermined color light; (2) a better brightness uniformity in each pixel region can be achieved; and (3) the amount of current demand of each pixel region is decreased so that the service life of the micro LEDs can be prolonged.

In order to make the aforementioned features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
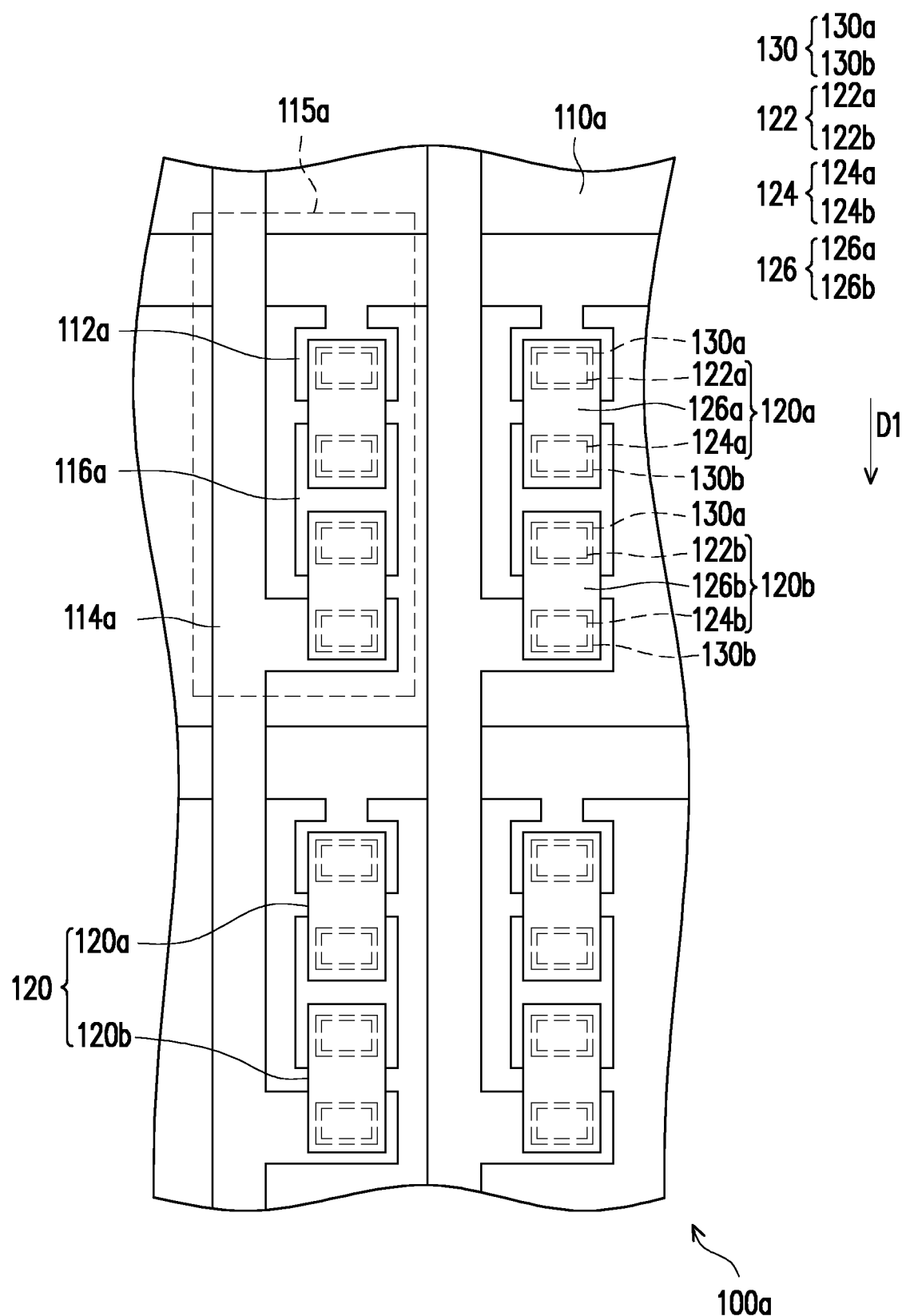
FIG. 1A is a partial top view of a display panel according to one embodiment of the invention.
Figure 1B:
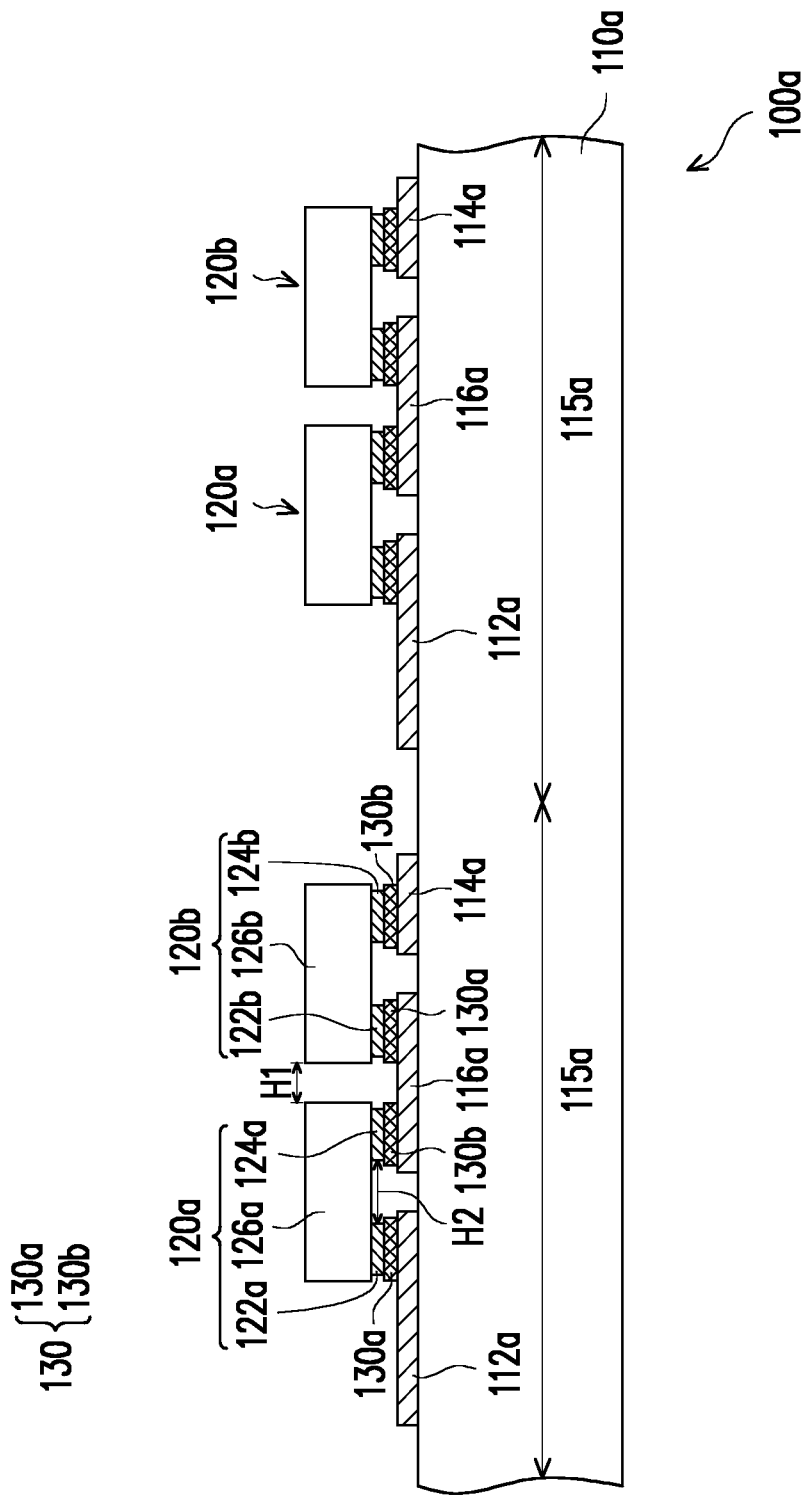
FIG. 1B is a sectional view of FIG. 1A taken along line I-I'.

FIG. 1A is a partial top view of a display panel according to one embodiment of the invention. FIG. 1B is a sectional view of FIG. 1A taken along line I-I'. Referring to both of FIGS. 1A and 1B, in the embodiment, a display panel 100a includes a driving substrate 110a and a plurality of micro light emitting diodes (LEDs) 120. The driving substrate 110a includes a plurality of pixel regions 115a. The micro LEDs 120 are disposed on the driving substrate 110a and arranged apart from each other. The micro LEDs 120 at least include a plurality of first micro LEDs 120a and a plurality of second micro LEDs 120b. In particular, each of the pixel regions 115a is at least provided with one first micro LED 120a and one second micro LED 120b, and the first micro LED 120a and the second micro LED 120b are electrically connected in series.

Specifically, the driving substrate 110a of the embodiment includes a plurality of first-type electrode layers 112a, a plurality of second-type electrode layers 114a and a plurality of conductive connecting layers 116a. As shown in FIG. 1A, in one of the pixel regions 115a, the first-type electrode layer 112a, the second-type electrode layer 114a and the connecting layer 116a are arranged apart from each other. It should be mentioned that the driving substrate 110a of the embodiment does not include active device such as a thin-film transistor, and is driven by voltage or current input via corresponding lateral and longitudinal wires. In other words, the micro LEDs 120 of the display panel 100a of the embodiment are driven using passive matrix. Briefly, the driving substrate 110a of the embodiment is practically a passive driving substrate.

Furthermore, the micro LEDs 120 of the embodiment are inorganic micro LEDs. A dominant wavelength of the first micro LED 120a and the second micro LED 120b connected in series in one pixel region 115a is within a wavelength range of a specific color light, but the invention provides no particular limitation thereto. Each of the micro LEDs 120 includes a first-type electrode 122, a second-type electrode 124 and an epitaxial layer 126, wherein the first-type electrode 122 and the second-type electrode 124 are disposed on the same side of the epitaxial layer 126. The first micro LED 120a and the second micro LED 120b in one pixel region 115a are arranged along a first direction D1, and the first-type electrode 122a and the second-type electrode 124a of the first micro LED 120a as well as the first-type electrode 122b and the second-type electrode 124b of the second micro LED 120b are arranged along the first direction D1. As shown in FIG. 1B, a first gap H1 between the first micro LED 120a and the second micro LED 120b in one pixel region 115a is smaller than a second gap H2 between the first-type electrode 122a and the second-type electrode 124a of the first micro LED 120a.

More specifically, in one pixel region 115a, there is the gap H1 between the first micro LED 120a and the second micro LED 120b that are electrically connected in series, wherein the first gap H1 is preferably from 1 μm to 15 μm. There is the second gap H2 between the first-type electrode 122a and the second-type electrode 124a of the first micro LED 120a, wherein the second gap H2 is preferably from 2 μm to 18 μm. Herein, the first gap H1 and the second gap H2 are practically a horizontal gap, respectively. Particularly, in each of the pixel regions 115a, since the first micro LED 120a and the second micro LED 120b are connected in series and the first gap H1 may be smaller than the second gap H2, the size of the pixel region 115a will be reduced effectively. Herein, a length of each of the micro LEDs 120 ranges from 3 μm to 50 μm, for example.

Referring to FIG. 1B again, in one pixel region 115a, the first-type electrode 122a of the first micro LED 120 is connected to the first-type electrode layer 112a; the second-type electrode 124a of the first micro LED 120a is connected to the connecting layer 116a; the first-type electrode 122b of the second micro LED 120b is connected to the connecting layer 116a; and the second-type electrode 124b of the second micro LED 120b is connected to the second-type electrode layer 114a. As a result, the first micro LED 120a and the second micro LED 120b that are connected in series is formed in one pixel region 115a. That is, in the same pixel region 115a, the first micro LED 120a and the second micro LED 120b may have the same current.

Moreover, the display panel 100a of the embodiment further includes a plurality of bonding pads 130 that are respectively disposed in corresponding to the first-type electrode 122 and the second-type electrode 124 of the micro LED 120. The bonding pads 130 are disposed and electrically connected between the first-type electrodes 122 and the first-type electrode layers 112a, between the second-type electrodes 124 and the second-type electrode layers 114a, and between the first-type electrodes 122 and the conducive connection layers 116a and between the second-type electrodes 124 and the conducive connection layers 116a. In one pixel region 115a, two bonding pads 130b and 130a are disposed on the connecting layer 116a. The second-type electrode 124a of the first micro LED 120a and the first-type electrode 122b of the second micro LED 120b contact to the two bonding pads 130b and 130a on the connecting layer 116a respectively. Herein, the bonding pads 130a and 130b are disposed on the first-type electrode layer 112a and the second-type electrode layer 114a respectively. The first-type electrode 122a of the first micro LED 120a is contacted with the first-type electrode layer 112a by the bonding pads 130a. The second-type electrode 124b of the first micro LED 120b is contacted with the second-type electrode layer 114a by the bonding pads 130b. The second-type electrode 124a of the first micro LED 120a is contacted with the connecting layer 116a by the bonding pads 130b. The first-type electrode 122b of the second micro LED 120b is contacted with the connecting layer 116a by the bonding pads 130a.

Briefly, according to the design of the display panel 100a of the embodiment, each of the pixel regions 115a in the passive driving substrate 110a is at least provided with the first micro LED 120a and the second micro LED 120b that are electrically connected in series. Therefore, when one micro LED (e.g. first micro LED 120a) in each of the pixel regions 115a is malfunctioned, another micro LED (e.g. second micro LED 120b) can still emit light so that each of the pixel regions 115a can be operated normally and performs predetermined color light. Accordingly, the display panel 100a of the embodiment can have a better display quality.

It should be indicated that the following embodiments adopt the reference numbers and a part of the content of the embodiments provided above, wherein the same reference numbers are used to denote the same or similar elements, and identical technical content is omitted. Please refer to the above embodiments for the omitted descriptions; no repetitions are incorporated in the following embodiments.

Figure 2:
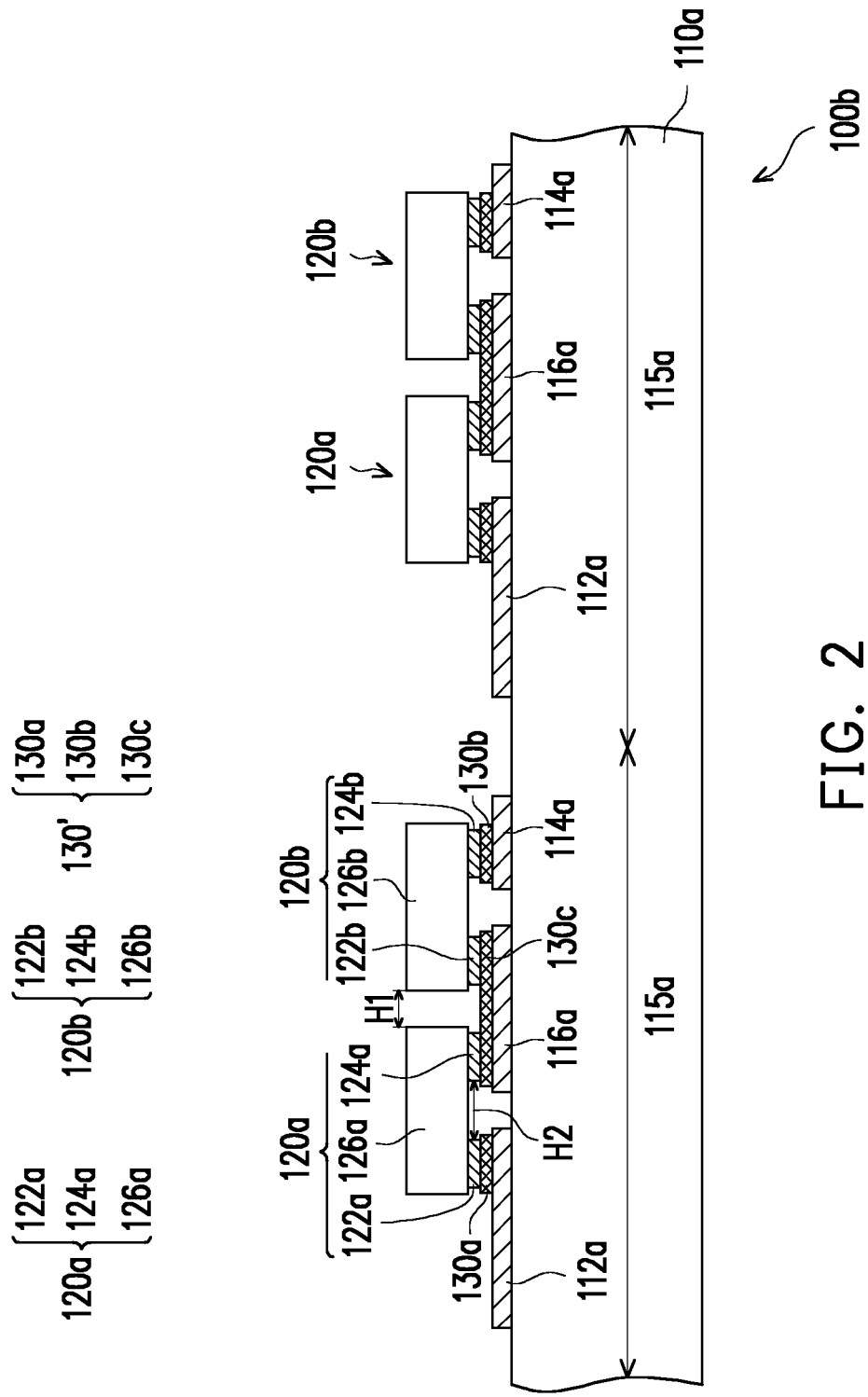
FIG. 2 is a partial sectional view of a display panel according to one embodiment of the invention.

FIG. 2 is a partial sectional view of a display panel according to one embodiment of the invention. Referring to both of FIGS. 1B and 2, a display panel 100b of the embodiment is similar to the display panel 100a of FIG. 1B; a difference between the two is that a bonding pad 130' of the embodiment is different from the bonding pad 130 of FIG. 1B. Specifically, in one pixel region 115a of the embodiment, a bonding pad 130c is disposed on the connecting layer 116a, and the second-type electrode 124a of the first micro LED 120a and the first-type electrode 122b of the second micro LED 120b contact with the bonding pad 130c on the connecting layer 116a. Herein, the bonding pads 130a and 130b are disposed on the first-type electrode layer 112a and the second-type electrode layer 114a respectively. The first-type electrode 122a of the first micro LED 120a and the second-type electrode 124b of the second micro LED 120b are respectively contacted with the bonding pad 130a on the first-type electrode layer 112a and the bonding pad 130b on the second-type electrode layer 114a.

Since the first micro LED 120a and the second micro LED 120b in each of the pixel regions 115a of the embodiment are electrically connected in series, the second-type electrode 124a and the first-type electrode 122b have no risk of short-circuit during transfer or bonding processes. In other words, the spacing between 120a and 120b could be very closer, so that the first gap H1 may be smaller than the second gap H2.

Figure 3A:
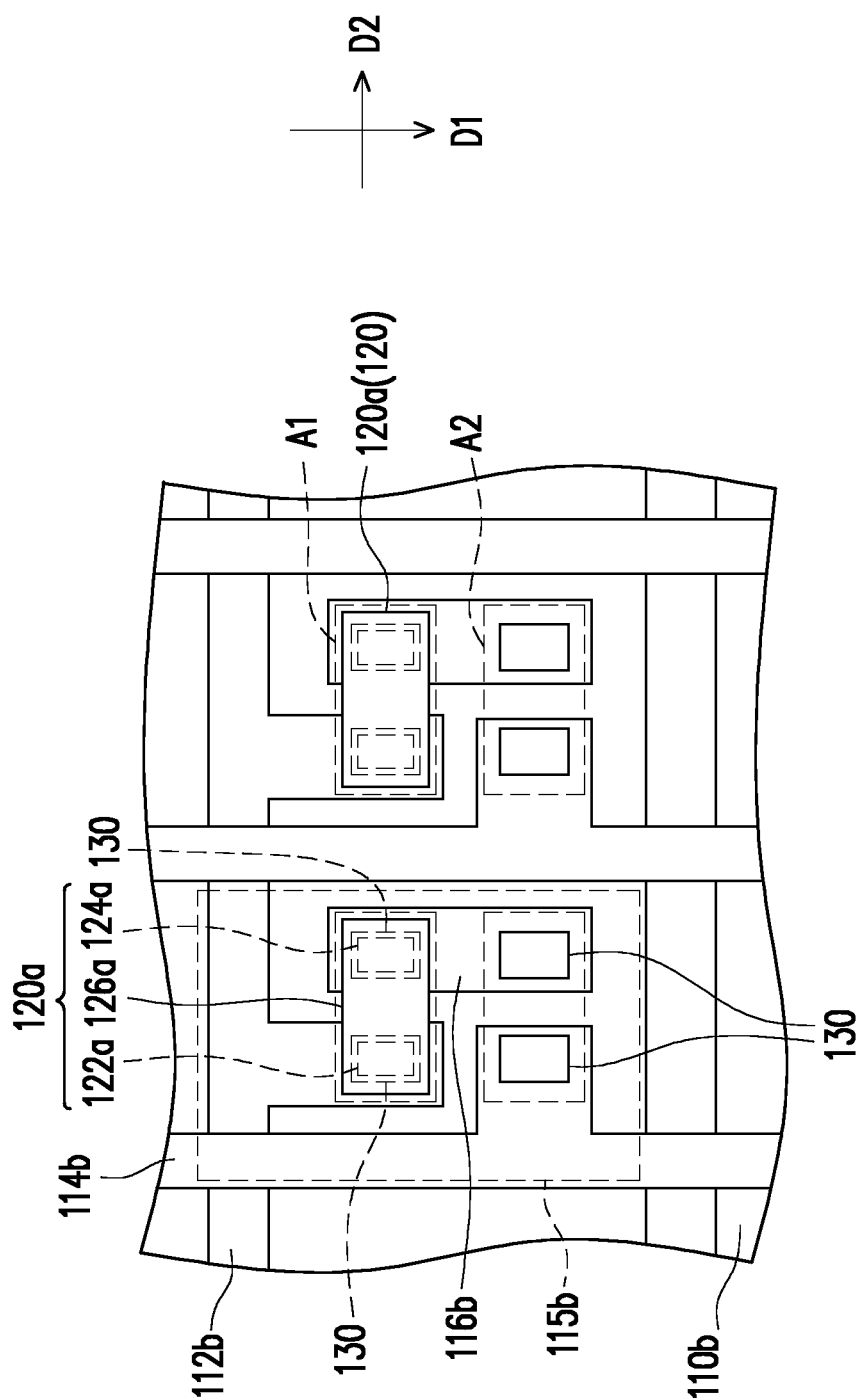
FIGS. 3A and 3B are top views of a pixel region of a display panel according to one embodiment of the invention.
Figure 3B:
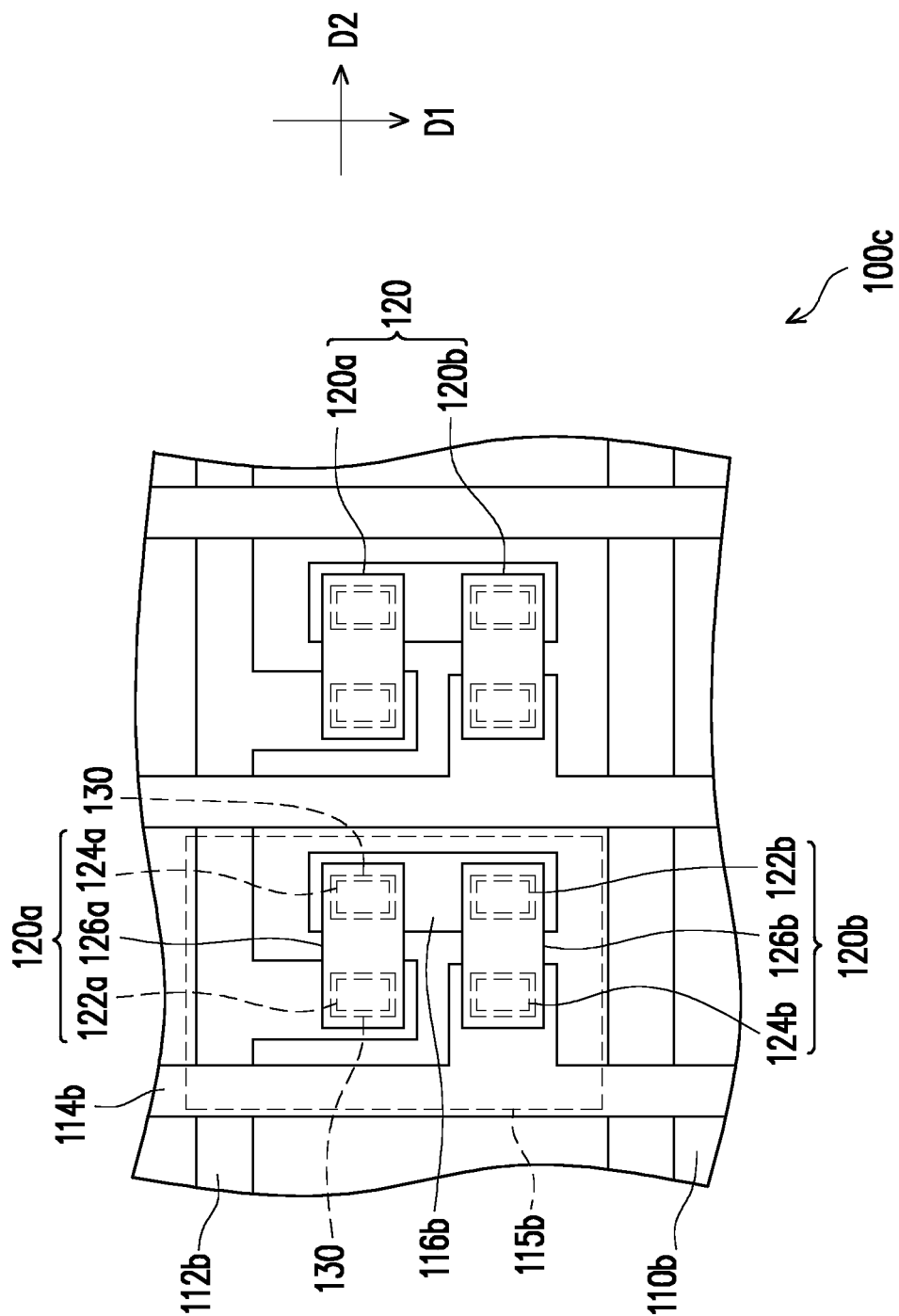

FIG. 3B is a top view of a pixel region of a display panel according to another one embodiment of the invention. Referring to both of FIGS. 1A and 3B, a display panel 100c of the embodiment is similar to the display panel 100a of FIG. 1A; a difference between the two is that the driving substrate 110b of the embodiment is practically an active driving substrate, which means that the driving substrate 110b has a plurality of active devices (e.g. a thin-film transistor, not shown) disposed thereon to control the micro LEDs 120 to emit light. Another difference between the two embodiments is the arrangement of the first micro LED 120a and the second micro LED 120b in one of the pixel regions 115b. Specifically, in one pixel region 115b of the embodiment, the first micro LED 120a and the second micro LED 120b are arranged along the first direction D1; the first-type electrode 122a and the second-type electrode 124a of the first micro LED 120a as well as the second-type electrode 124b and the first-type electrode 122b of the second micro LED 120b are arranged along a second direction D2; and the first direction D1 is different from the second direction D2. As shown in FIG. 3B, in one pixel region 115b, the first-type electrode 122a of the first micro LED 120a is adjacent to the second-type electrode 124b of the second micro LED 120b, and the second-type electrode 124a of the first micro LED 120a is adjacent to the first-type electrode 122b of the second micro LED 120b. Accordingly, the first micro LED 120a and the second micro LED 120b that are connected in series with the same current are formed in one pixel region 115b.

More specifically, the micro LEDs 120 of the embodiment are bonded to the driving substrate 110a via a mass transfer method. The micro LEDs 120 are transferred from a growth wafer (e.g. a sapphire substrate) to the driving substrate 110a by plural transfer process with a transfer apparatus. Generally speaking, the transfer apparatus picks up micro LEDs 120 with a predetermined range of size from the growth wafer. Then, after aligning the driving substrate 110a as shown in FIG. 3A, a portion of the micro LEDs 120 on the transfer apparatus are transferred and bonded to a first position A1 in the pixel region 115b to form the first micro LEDs 120a at a predetermined position. Afterwards, a relative relationship between the transfer apparatus and the driving substrate 110a is turned 180 degrees, so that another portion of the micro LED 120 on the transfer apparatus is transferred and bonded to a second position A2 in the pixel region 115b. The arrangement of the first micro LED 120a and the second micro LED 120b as shown in FIG. 3B is designed. Due to epitaxial process variation, a characteristic distributing trend (e.g. wavelength variation) of the micro LEDs 120 may occur on growth wafer. For example, the wavelength decreases from left to right on growth wafer. Therefore, preferably, in one pixel region 115b of the embodiment, by performing two times of transfer and bonding processes, the first micro LED 120a and the second micro LED 120b in the same pixel region 115b can be distributed in the corresponding positions on the transfer apparatus. As a result, the light-emitting characteristics can be mutually compensated for each other, and the uniformity of the overall display panel 100c can be improved.

Briefly, in the design of the display panel 100c of the embodiment, each of the pixel regions 115b of the active driving substrate 110b is at least provided with the first micro LED 120a and the second micro LED 120b electrically connected to first micro LED 120a in series. The first micro LED 120a and the second micro LED 120b are arranged along the first direction D1; the first-type electrode 122a and the second-type electrode 124a of the first micro LED 120a are arranged along a second direction D2; wherein the first direction D1 is different from direction D2. As a result, the light emitted by the first micro LED 120a and the second micro LED 120b in the same pixel region 115b can be complementary, so that brightness uniformity within the pixel regions 115b is better. Therefore, the display panel 110c of the embodiment can have a better display quality. In addition, aforementioned design can also effectively reduce the driving current to the micro LEDs 120, thereby the life time of the micro LEDs 120 could be prolonged.

Figure 4:
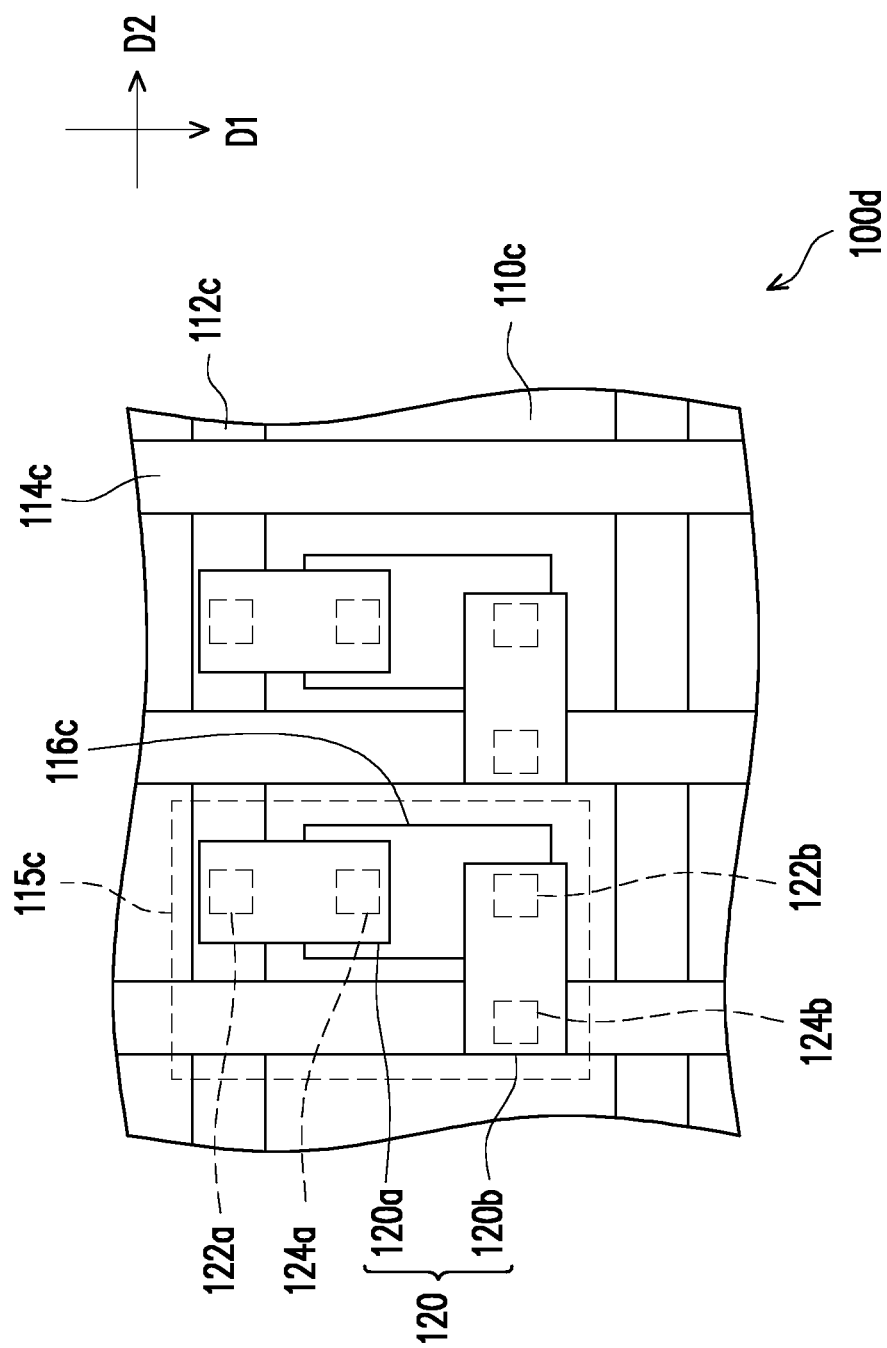
FIG. 4 is a top view of a pixel region of a display panel according to another embodiment of the invention.

FIG. 4 is a top view of a partial of a display panel according to another embodiment of the invention. For ease of description, FIG. 4 omits the bonding pad. Referring to both of FIGS. 1A and 4, a display panel 100d of the embodiment is similar to the display panel 100a of FIG. 1A; a difference between the two is that, in one pixel region 115c of the embodiment, the first micro LED 120a is arranged along the first direction D1, and the second micro LED 120b is arranged along the second direction D2, wherein the first direction D1 is different from the second direction D2. In one pixel region 115c, the first-type electrode 122a of the first micro LED 120a is electrically connected to the first-type electrode layer 112c of the driving substrate 110c; the second-type electrode 124a of the first micro LED 120a and the first-type electrode 122b of the second micro LED 120b are electrically connected to the connecting layer 116c of the driving substrate 110c; and the second-type electrode 124b of the second micro LED 120b is electrically connected to the second-type electrode layer 114c of the driving substrate 110c. In other words, 122a and 124a are arranged along the first direction D1, and 122b and 124b are arranged along the second direction D2. Accordingly, the first micro LED 120a and the second micro LED 120b can be connected in series with each other and have the same current in one pixel region 115c. The above-mentioned arrangement can improve the circuit layout of the display panel 100d for reducing pixel size and having higher resolution.

Figure 5:
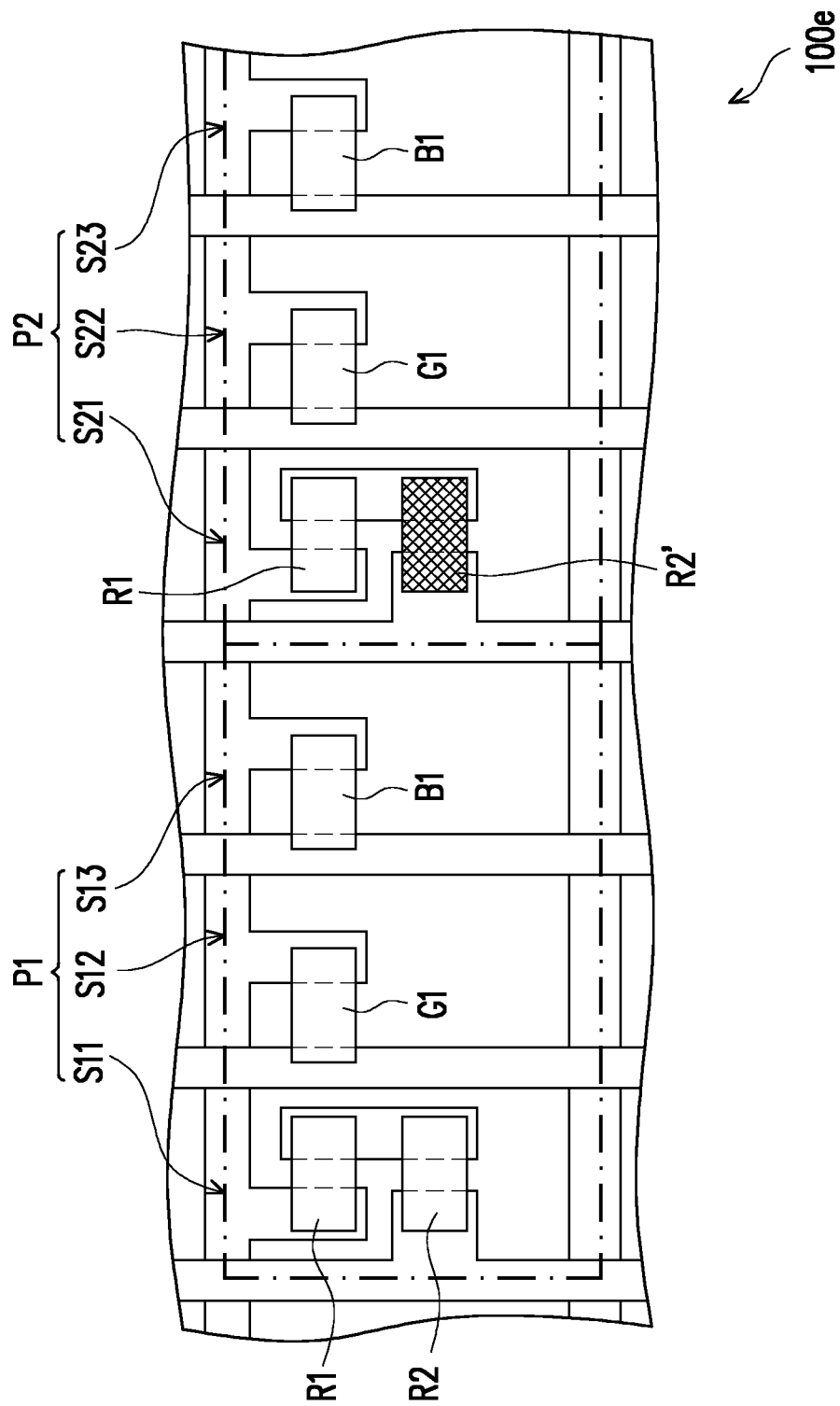
FIG. 5 is a top view of a pixel region of a micro LED display panel according to another embodiment of the invention.

FIG. 5 is a top view of a pixel region of a micro LED display panel according to another embodiment of the invention. Referring to both of FIGS. 1A and 5, a display panel 100e of the embodiment is similar to the display panel 100a of FIG. 1A; a difference between the two is that, each of the pixel regions includes a plurality of sub-pixel regions. In more detail, the pixel regions P1 includes a first sub-pixel region S11, a second sub-pixel region S12 and a third sub-pixel region S13, and sizes of the first sub-pixel region S11, the second sub-pixel region S12 and the third sub-pixel region S13 are the same. Similarly, the pixel regions P2 includes a first sub-pixel region S21, a second sub-pixel region S22 and a third sub-pixel region S23, and sizes of the first sub-pixel region S21, the second sub-pixel region S22 and the third sub-pixel region S23 are the same. At least one of the sub-pixel regions is provided with two micro LEDs of the plurality of micro LEDs electrically connected in series. Herein, the first sub-pixel region S11, S21 are respectively provided with two micro LEDs electrically connected in series, and a dominant wavelength of the two micro LEDs is within a wavelength range of a specific color light. Herein, the two red micro LEDs R1, R2 are located in the first sub-pixel region S11 and electrically connected in series, and two red micro LEDs R1, R2' are located in the first sub-pixel region S21 and electrically connected in series.

Furthermore, the second sub-pixel region S12, S22 are respectively provide with a green micro LED G1, and the third sub-pixel region S13, S23 are respectively provide with a blue micro LED B1. Particularly, in a normal sub-pixel region of the sub-pixel regions, for example, the first sub-pixel region S11, both of the two red micro LEDs R1, R2 emit light. In a repaired sub-pixel region of the sub-pixel regions, for example, the first sub-pixel region S21, only the red micro LED R1 emits light. In other words, only one of the two micro LEDs R1, R2' emits light, i.e. the red micro LED R2' is a failed micro LED and does not emit light, and the red micro LED R1 is a normal LED which can emit light and is used for compensation.

In order to make the repaired sub-pixel region and the normal sub-pixel region show the same brightness, under the same specific brightness condition, a current input to the repaired sub-pixel region (i.e. the first sub-pixel region S21) is greater than a current input to the normal sub-pixel region (i.e. the second sub-pixel region S11). In brief, when one micro LED (i.e. the red micro LED R2') in each sub-pixel region (i.e. the first sub-pixel region S21) is malfunctioned, another micro LED (i.e. the red micro LED R1) can still emit light normally, so that the pixel region P2 can operate normally and emit the predetermined color light.

Figure 6:
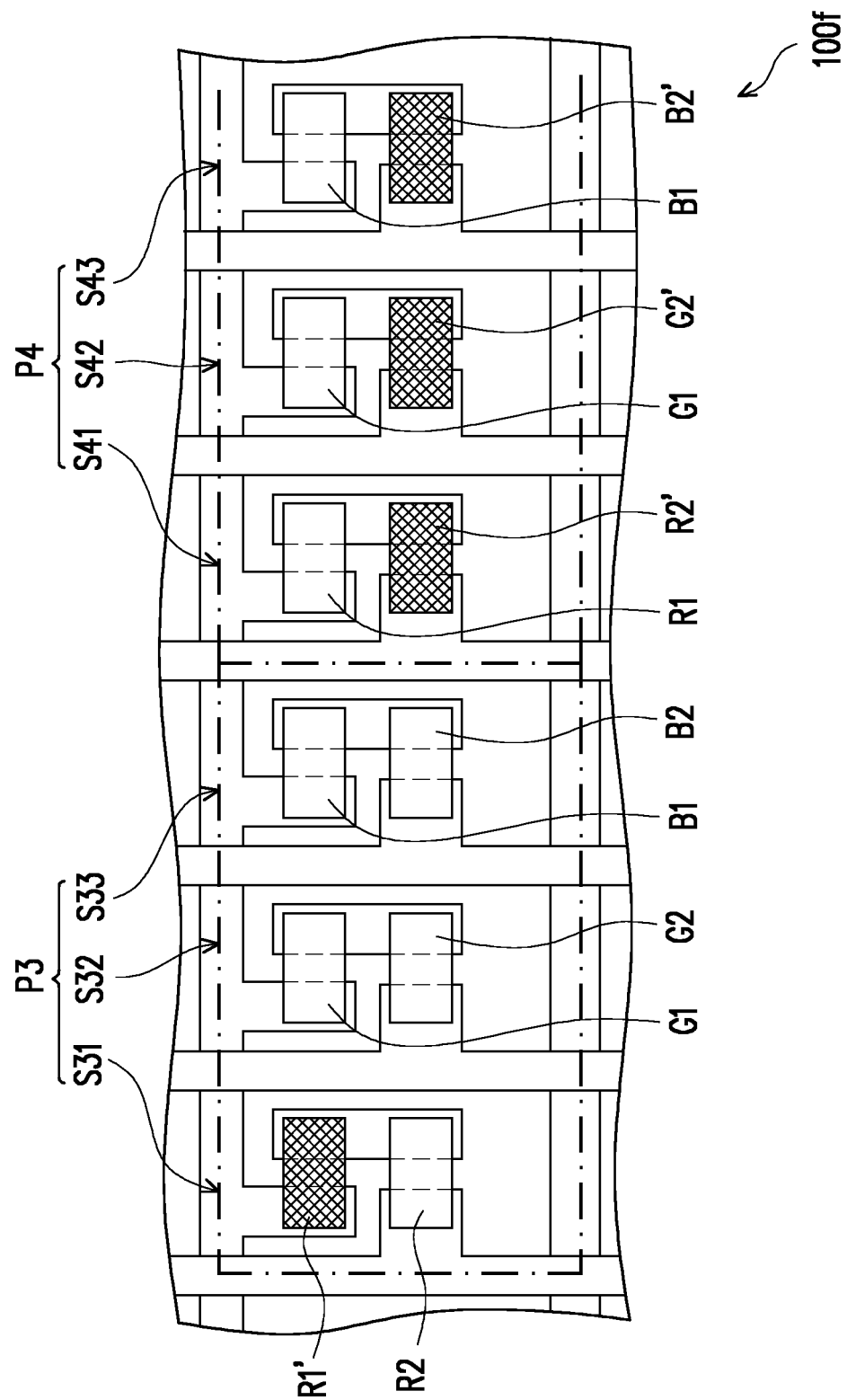
FIG. 6 is a top view of a pixel region of a micro LED display panel according to another embodiment of the invention.

FIG. 6 is a top view of a pixel region of a micro LED display panel according to another embodiment of the invention. Referring to both of FIGS. 5 and 6, a display panel 100f of the embodiment is similar to the display panel 100e of FIG. 5; a difference between the two is that each sub-pixel region has two micro LEDs in series. For example, in the pixel regions P3, the second sub-pixel region S32 is provide with two green micro LEDs G1, G2 electrically connected in series, and the third sub-pixel region S33 is provide with two blue micro LEDs B1, B2 electrically connected in series. Similarly, in the pixel regions P4, the second sub-pixel region S42 is provide with two green micro LEDs G1, G2' electrically connected in series, and the third sub-pixel region S43 is provide with two blue micro LEDs B1, B2' electrically connected in series.

Herein, in the pixel regions P3, the normal sub-pixel regions are the second sub-pixel region S32 and the third sub-pixel region S33, and the repaired sub-pixel region is the first sub-pixel region S31, so both of the two green micro LEDs G1, G2, and both of the two blue micro LEDs B1, B2 emit light, and only the red micro LED R2 emits light. In the pixel regions P4, there is no normal sub-pixel regions, and the repaired sub-pixel region is the first sub-pixel region S41, the second sub-pixel region S42 and the third sub-pixel region S43, so only the red micro LED R1, the green micro LED G1 and the blue micro LED B1 emit light. Under the same specific brightness condition between the pixel regions P3 and P4, a current input to the repaired sub-pixel region (i.e. the first sub-pixel region S42 and the third sub-pixel region S43) is greater than a current input to the normal sub-pixel region (i.e. the second sub-pixel region S32 and the third sub-pixel region S33), so that the repaired sub-pixel region and the normal sub-pixel region show the same brightness. On the other hand, Current input to the first sub-pixel region S31 of the pixel region P3 and the first sub-pixel region S41 of the pixel region P4 are all the same.

In other embodiment, another way to balance the brightness is to adjust the lighting time. For example, in normal sub-pixel, both two micro LEDs electrically in series will emit light, and in repaired sub-pixel, only one of the two micro LEDs electrically in series will emit light. Therefore, the light-emitting time of the micro LED in repaired sub-pixel is adjusted to be longer than the light-emitting time of the micro LEDs in normal sub-pixel to make the brightness uniform through integration.

Figure 7A:
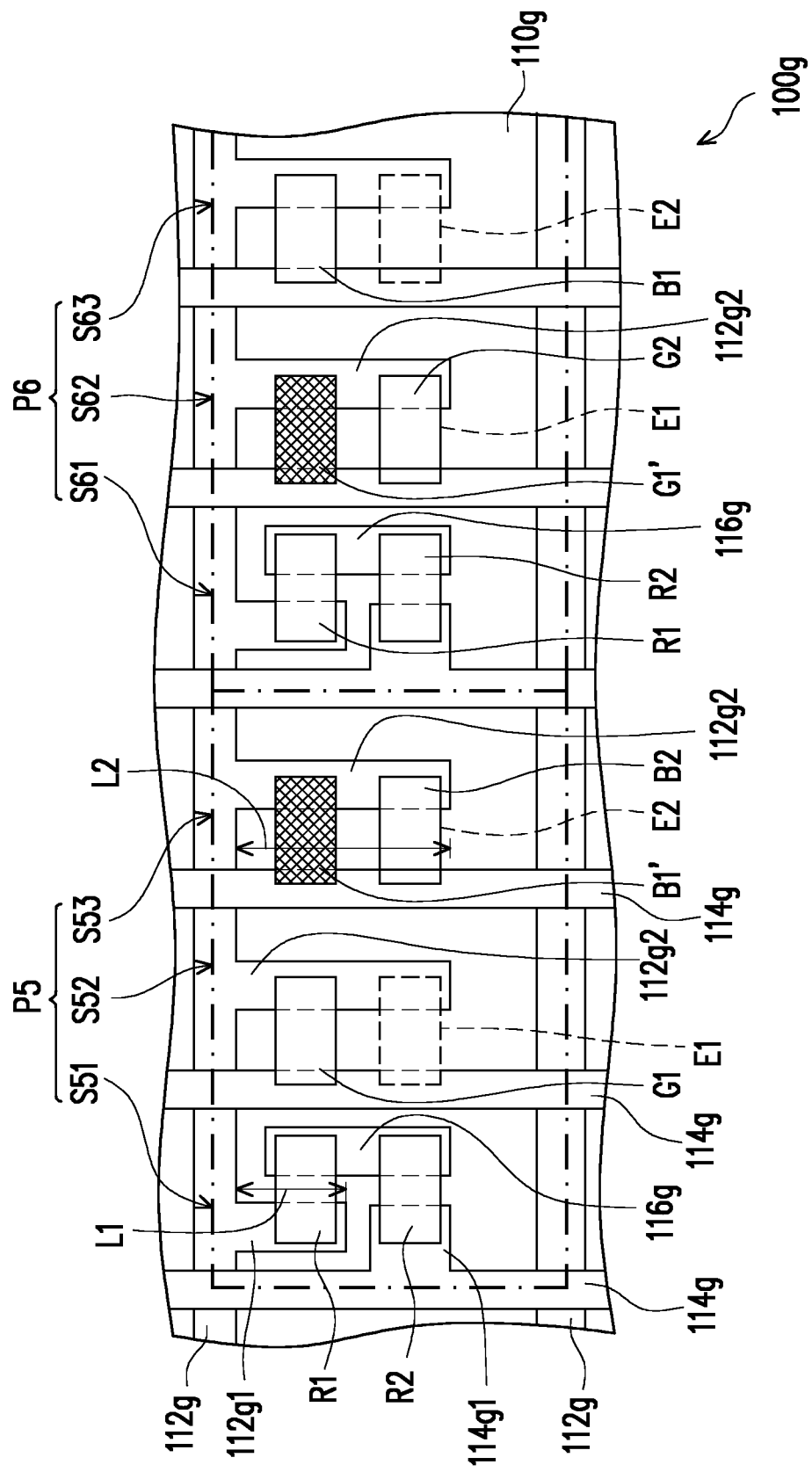
FIG. 7A is a top view of a pixel region of a micro LED display panel according to another embodiment of the invention.
Figure 7B:
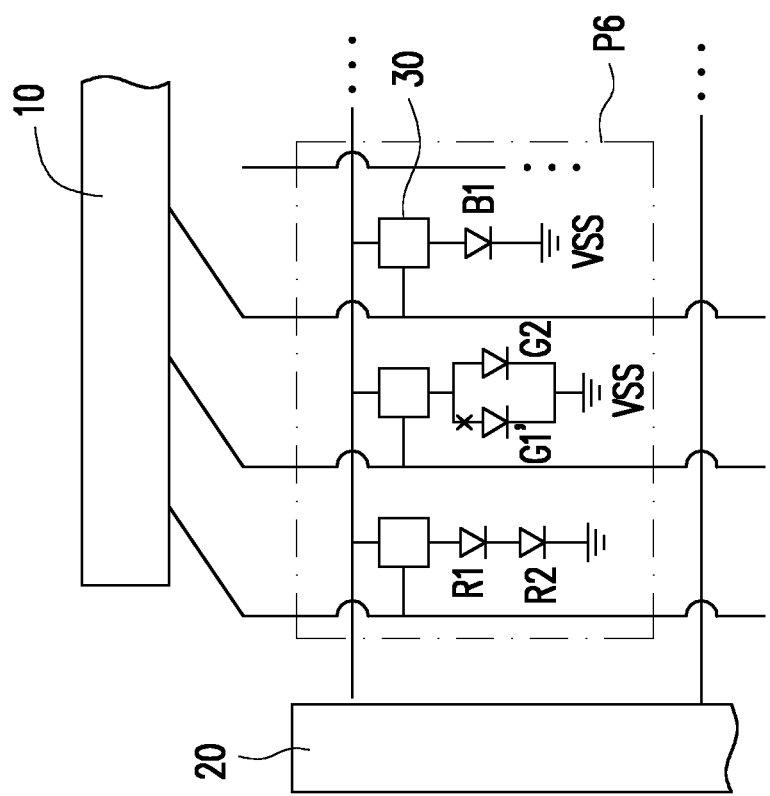
FIG. 7B is a schematic diagram of a circuit of a pixel region in FIG. 7A.

FIG. 7A is a top view of a pixel region of a micro LED display panel according to another embodiment of the invention. FIG. 7B is a schematic diagram of a circuit of a pixel region in FIG. 7A. Referring to FIGS. 5, 7A and 7B, a display panel 100g of the embodiment is similar to the display panel 100e of FIG. 5; a difference between the two is that, in each pixel region, the first sub-pixel region has two micro LEDs in series but the second/third sub-pixel has redundancy circuit design and only one micro LED. In more detail, in the first sub-pixel region, the repair of the design of two red micro LEDs electrically connected in series is as described above; and in the second and third sub-pixel regions, if the blue or green micro LED is found to be failed after detection, a good blue or green micro LED must be transferred to the redundancy position. Herein, the circuit design of redundancy position is a parallel circuit which is different from the circuit design of first sub-pixel region in series circuit.

Herein, the driving substrate 110g further includes a plurality of first-type electrode layers 112g, a plurality of second-type electrode layers 114g and a plurality of connecting layers 116g. The first-type electrode layers 112g includes a plurality of first portions 112g1 and a plurality of second portions 112g2. A first length L1 of each of the first portions 112g1 is smaller than a second length L2 of each of the second portions 112g2. A portion of the second-type electrode layers 114g includes a plurality of protrusions 114g1. The first sub-pixel region S51, S61 is provided with one of the first portions 112g1, one of the protrusions 114g1, and one of the connecting layers 116g. The second sub-pixel region S52, S62 and the third sub-pixel region S53, S63 are respectively provided with one of the second portions 112g2 and one of the second-type electrode layers 114g without the protrusions 114g1.

In this embodiment, in the pixel regions P5, the second sub-pixel region S52 is further provide with a first redundancy position E1, and the third sub-pixel region S53 is further provide with a second redundancy position E2 and another blue micro LED B2 located on the second redundancy position E2 and electrically connected in parallel with the blue micro LED B1'. In the pixel regions P6, the second sub-pixel region S62 is further provide with a first redundancy position E1 and another green micro LED G2 located on the first redundancy position E1 and electrically connected in parallel with the green micro LED G1', and the third sub-pixel region S63 is further provide with a second redundancy position E2. Herein, the normal sub-pixel regions are the first sub-pixel region S51, S61, the second sub-pixel region S52 and the third sub-pixel region S63, and the repaired sub-pixel region is the second sub-pixel region S62 and the third sub-pixel region S53.

As shown in FIG. 7A and FIG. 7B, a data driver 10 and a scan driver 20 are arranged around the pixel regions. A plurality of pixel driving circuits 30 are electrically connected to the data driver 10, the scan driver 20 and the micro LEDs, and each sub-pixel region has one of the pixel driving circuits 30. Particularly, in the design of the display panel 100g of the embodiment, in each pixel region (i.e. the pixel region P6), the arrangement of the micro LEDs adopt both series and parallel electrical arrangements. In more detail, in the first sub-pixel region S61, the two red micro LEDs R1, R2 are electrically connected in series, and in the second sub-pixel region S62, the two green micro LEDs G1', G2 are electrically connected in parallel. One side of the two red micro LEDs R1, R2 are electrically connected to the first portion 112g1 and the protrusion 114g1, and the other side of the two red micro LEDs R1, R2 are both electrically connected to the connecting layers 116g. One side of the two green micro LEDs G1', G2 are electrically connected to the second portions 112g2, and the other side of the two green micro LEDs G1', G2 are electrically connected to the second-type electrode layers 114g without the protrusions 114g1. In brief, if there are two red micro LEDs in one sub-pixel region, the two red micro LEDs are electrically connected in series; but, if there are two blue or green micro LEDs in one sub-pixel region, the two blue or green micro LEDs are electrically connected in parallel.

As shown in FIG. 7A and FIG. 7B again, in the pixel regions P5, the normal sub-pixel regions are the first sub-pixel region S51 and the second sub-pixel region S52, and the repaired sub-pixel region is the third sub-pixel region S53, so both of the two red micro LEDs R1, R2, the green micro LED G1 emit light, and only the blue micro LED B2 disposed in redundancy position emits light. On the other hand, in the pixel regions P6, the normal sub-pixel regions are the first sub-pixel region S61 and the third sub-pixel region S63, and the repaired sub-pixel region is the second sub-pixel region S62, so both of the two red micro LEDs R1, R2, the blue micro LED B1 emit light, and only the green micro LED G2 emits light. Under the same specific brightness condition between the pixel region P5 and P6, a current input to the repaired sub-pixel region (i.e. the third sub-pixel region S53) is the same with a current input to the normal sub-pixel region (i.e. the third sub-pixel region S63), so that the repaired sub-pixel region and the normal sub-pixel region display the same brightness.

In summary, in the design of the display panel of the invention, each of the pixel regions is at least provided with two micro LEDs connected in series; therefore, the display panel of the invention at least has one of the following advantages: (1) when one micro LED in each of the pixel regions is malfunctioned, another micro LED can still emit light normally; (2) a better brightness uniformity in each of the pixel regions can be achieved; and (3) the amount of current demand is reduced.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A micro LED display panel, comprising:
    a driving substrate, comprising a plurality of pixel regions, each of the plurality of pixel regions comprising a plurality of sub-pixel regions; and
    a plurality of micro light emitting diodes (LEDs), disposed on the driving substrate, wherein at least one of the plurality of sub-pixel regions is provided with two micro LEDs of the plurality of micro LEDs electrically connected in series, and a dominant wavelength of the two micro LEDs is within a wavelength range of a specific color light, in a repaired sub-pixel region of the plurality of sub-pixel regions, only one of the two micro LEDs emits light, and in a normal sub-pixel region of the plurality of sub-pixel regions, both of the two micro LEDs emit light,
    wherein the plurality of sub-pixel regions comprises a first sub-pixel region, a second sub-pixel region and a third sub-pixel region, the first sub-pixel region, the second sub-pixel region and the third sub-pixel region are respectively the repaired sub-pixel region or the normal sub-pixel region, and sizes of the first sub-pixel region, the second sub-pixel region and the third sub-pixel region are the same,
    wherein the two micro LEDs are located in the first sub-pixel region,
    wherein the second sub-pixel region is further provide with a first redundancy position, and the third sub-pixel region is further provide with a second redundancy position.

2. The micro LED display panel as claimed in claim 1, wherein under the same specific brightness condition, a current input to the repaired sub-pixel region is greater than a current input to the normal sub-pixel region.

3. The micro LED display panel as claimed in claim 1, wherein the two micro LEDs are two red micro LEDs.

4. The micro LED display panel as claimed in claim 1, wherein the second sub-pixel region is further provide another green micro LED of the plurality of micro LEDs located on the first redundancy position and electrically connected in parallel with the green micro LED of the plurality of micro LEDs.

5. The micro LED display panel as claimed in claim 4, wherein in the first sub-pixel region, both of the two red micro LEDs emit light, in the second sub-pixel region, only the another green micro LED emits light, and in the third sub-pixel region, the blue micro LED emits light.

6. The micro LED display panel as claimed in claim 1, wherein the third sub-pixel region is further provide another blue micro LED of the plurality of micro LEDs located on the second redundancy position and electrically connected in parallel with the blue micro LED of the plurality of micro LEDs.

7. The micro LED display panel as claimed in claim 6, wherein in the first sub-pixel region, both of the two red micro LEDs emit light, in the second sub-pixel region, the green micro LED emits light, and in the third sub-pixel region, only the another blue micro LED emits light.

8. The micro LED display panel as claimed in claim 1, wherein the driving substrate further comprises a plurality of first-type electrode layers, a plurality of second-type electrode layers and a plurality of connecting layers, the plurality of first-type electrode layers comprises a plurality of first portions and a plurality of second portions, a first length of each of the plurality of first portions is smaller than a second length of each of the plurality of second portions, a portion of the plurality of second-type electrode layers comprises a plurality of protrusions, the first sub-pixel region is provided with one of the plurality of first portions, one of the plurality of protrusions, and one of the connecting layers, the second sub-pixel region and the third sub-pixel region are respectively provided with one of the plurality of second portions and one of the plurality of second-type electrode layers without the plurality of protrusions.

9. The micro LED display panel as claimed in claim 1, wherein a length of each of the plurality of micro LEDs ranges from 3 µm to 50 µm.

* * * * *